United States Patent [19]

Hermanutz et al.

[11] Patent Number: 4,924,354
[45] Date of Patent: May 8, 1990

[54] GUIDE RAIL COMPRISING ATTACHMENT MEANS FOR A PLUG BOARD

[75] Inventors: Helmut Hermanutz, Straubenhardt; Fred Koch, Gaggenau; Hans M. Schwenk, Straubenhardt, all of Fed. Rep. of Germany

[73] Assignee: Schroff Gesellschaft mit beschrankter Haftung, Industriegebiet, Fed. Rep. of Germany

[21] Appl. No.: 892,289

[22] Filed: Aug. 4, 1986

Related U.S. Application Data

[63] Continuation of Ser. No. 653,521, Sep. 24, 1984, abandoned.

[30] Foreign Application Priority Data

Sep. 22, 1983 [DE] Fed. Rep. of Germany ... 8327191[U]

[51] Int. Cl.$^5$ .............................................. H05K 7/18
[52] U.S. Cl. .................................... 361/415; 211/41; 439/64

[58] Field of Search ................. 211/4.1; 361/413, 415, 361/412, 426, 429, 391; 339/65, 75 MP, 176 MP, 17 L, 17 LC, 17 M, 17 LM, 17 N

[56] References Cited

U.S. PATENT DOCUMENTS

| 3,733,523 | 5/1973 | Reynolds | 361/415 |
| 3,801,953 | 4/1974 | Lynch | 339/65 |
| 3,932,016 | 1/1976 | Ammenheuser | 339/65 |
| 3,939,382 | 2/1976 | Lacan | 211/41 |

Primary Examiner—Gerald P. Tolin
Attorney, Agent, or Firm—Antonelli, Terry & Wands

[57] ABSTRACT

The invention concerns a guide rail for printed circuit boards in industrial electronic equipment, which guide rail has, at one of its ends, an attachment means 1 for a spring contact strip 5 provided with electrical connections. This attachment means 1 consists of a retaining limb 2, which is applied at right angles at the end of the guide rail and carries a holding lug 4, and of an angled resilient tongue 3 extending towards this holding lug 4.

1 Claim, 2 Drawing Sheets

GUIDE RAIL COMPRISING ATTACHMENT MEANS FOR A PLUG BOARD

This is a continuation of application Ser. No. 653,521, filed Sept. 24, 1984, now abandoned.

The invention concerns a guide rail for printed circuit boards in industrial electronic equipment and comprising, at its end, attachment means for a spring contact strip.

The proposed guide rails are used in pairs for assembling printed circuit boards provided with electronic components and as employed in industrial electronic equipment.

Guide rails for printed circuit boards have been known for a long time. For the purpose of effecting a releasable electrical contact, the printed circuit boards are provided at their ends with plug boards which are inserted in complementary spring contact strips secured in the housing of the equipment. In this system, the guide rails, likewise fitted in the housing of the equipment, enable the printed circuit board to be inserted and removed without difficulty. The spring contact strips, most of which are standardized, have at each of their two ends an attachment base comprising a bore, so that they are usually secured in the housing of the equipment by means of two screws. This mode of assembly is troublesome and time-consuming. Furthermore, care has to be taken to ensure that the guide rails and the spring contact strip can be precisely aligned.

The object of the invention is to provide a guide rail to which a commercially available spring contact strip can be safely attached in a precisely aligned manner with minimal trouble and without additional attachment means.

According to the invention and in the case of a guide rail of the initially described kind, this object is achieved by means of a guide rail.

For effecting assembly, a spring contact strip is inserted, in the same direction as the printed circuit board is later inserted, between two guide rails which are already introduced into the housing of the equipment. The resilient tongues are pressed so far outwardly into the bodies of the guide rails that the attachment base of the spring contact strip is able to pass. The holding lugs provided on the retaining limbs of the guide rails slide into the bores in the attachment base of the spring contact strip, which bores are originally intended for the purpose of assembly by means of screws. As soon as the spring contact strip reaches its intended position, the resilient tongues return to their original position and then automatically and immovably hold the spring contact strip on the holding lugs of the retaining limbs. In this way, a single manual action suffices for inserting the spring contact strip into the attachment means of the guide rail. Removal of the spring contact strip that may be necessary in the case of damage, for example, can likewise be carried out in a very simple manner; for this purpose, all that is necessary is to apply slight rearward manual pressure to the resilient tongues of the guide rails in order to enable the spring contact strip to be removed from the holding lugs and the retaining limbs.

In an advantageous embodiment of the invention, the resilient tongue is formed integrally with the guide rail. The material used is a resilient plastics substance.

In a preferred construction of the guide rail in accordance with the invention, the resilient tongue has a resilient part of rectangular cross-section and a clip part of U-shaped cross-section. The rectangular resilient part can bend elastically and thus permits the resilient tongue to deflect in the required manner at right angles to the longitudinal axis of the guide rail. The spring properties can be determined in a very simple manner by selecting a suitable size for the spring part. The use of a clip part having a U-shaped cross-section imparts considerable rigidity to this part of the resilient tongue, this property being essential for efficient retention of the spring contact strip.

Advantageously, the resilient tongue has a rectangular space at its end. The dimensions of this space match the attachment base of the spring contact strip that is fitted and the recess thus serves to ensure that the spring contact strip is secured to the holding lug of the retaining limb in the best possible way.

An example of the form of construction of the proposed guide rail will now be described by reference to the attached drawings, in which.

Figure 1:
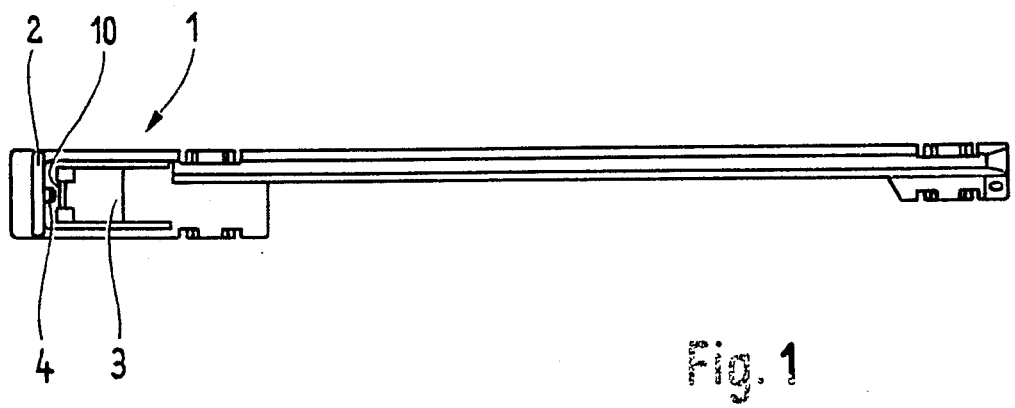
FIG. 1 is a plan view of the guide rail roughly in its actual size.

The guide rail of the invention, illustrated in FIG. 1, has at one of its ends, an attachment means 1 for receiving a spring contact strip (not illustrated). This attachment means 1 consists of a retaining limb 2, which is attached at right angles to the end of the guide rail 1, and of a resilient tongue 3. The retaining limb 2 carries a cylindrical holding lug 4. The resilient tongue 3 is angled and its tip is directed towards the holding lug 4.

Figure 2:
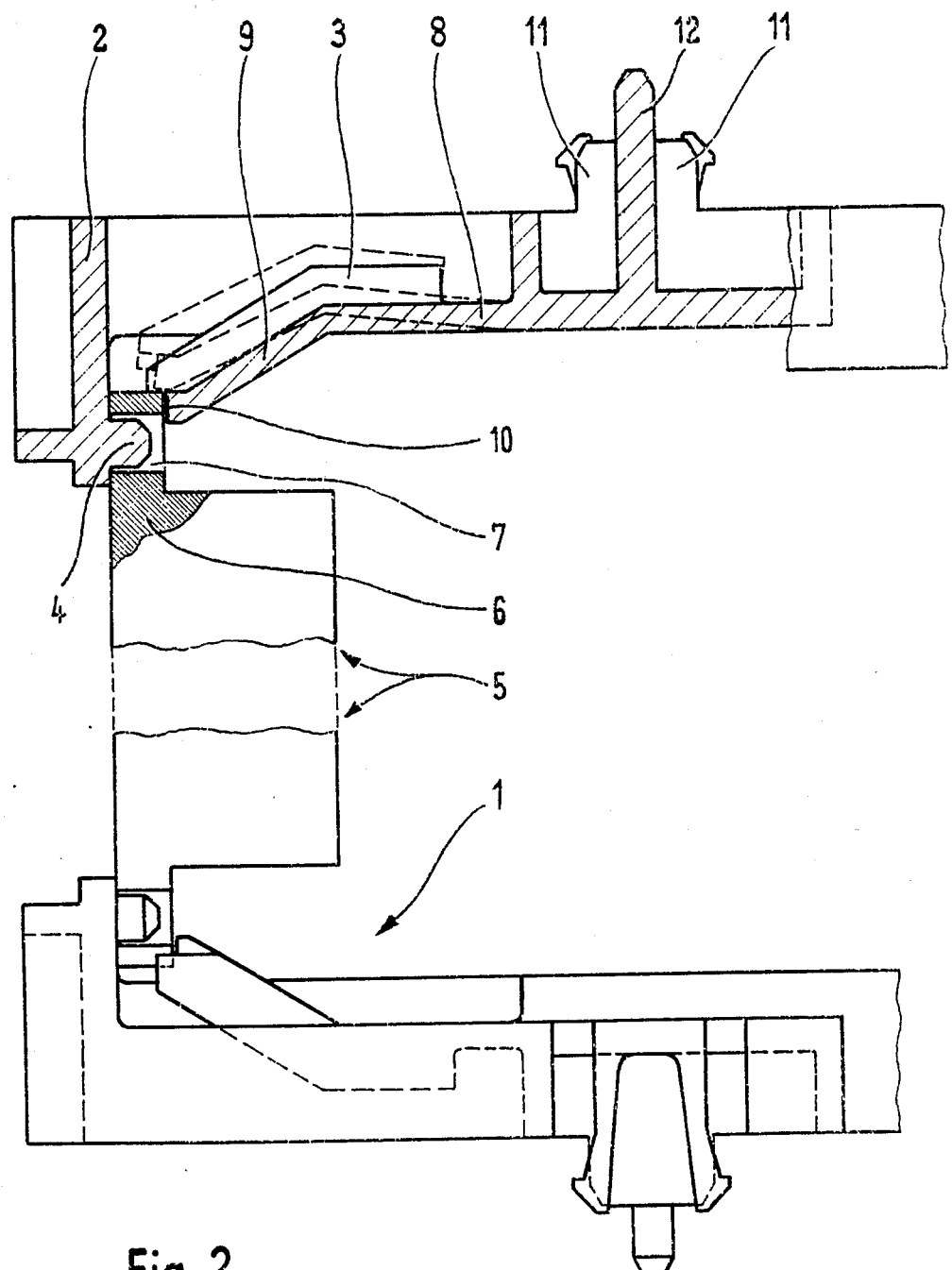
FIG. 2 illustrates, on a larger scale and in side view, the attachment means for two guide rails as shown in FIG. 1, the upper guide rail being shown in section.

The spring contact strip 5, illustrated in FIG. 2, is inserted into the attachment means 1 of two guide rails. The attachment base 6 of the spring contact strip 5 is pressed by the resilient tongues 3 against the retaining limbs 2. The holding lugs 4 engage in bores 7 in the attachment base 6 of the spring contact strip 5. Each of the resilient tongues 3 has a resilient part 8 of rectangular cross-section as well as a clip part 9. Rectangular spaces 10 (see also FIG. 1) at the ends of the resilient tongues 3 also serve to secure the spring contact strip 5 more firmly on the holding lugs 4, 4. Clip blocks 11 with guide pins 12 are provided for fitting the guide rails in the housing of the equipment.

We claim:

1. A guide rail for printed circuitboards in industrial electronic equipment comprising an attachment member for a spring contact strip made up of a retaining limb attached at right angles at one end of the guide rail, a holding lug formed on said retaining limb, and an angled resilient tongue formed on the guide rail and extending toward the holding lug so as to enable a mounting of the spring contact in the guide rail, and wherein an end of the resilient tongue defines a rectangular space with a portion of the retaining limb for ensuring a firm mounting of the spring contact strip on the holding lug.

* * * * *